United States Patent [19]

Yamamoto et al.

[11] Patent Number: 5,266,832
[45] Date of Patent: Nov. 30, 1993

[54] SEMICONDUCTOR APPARATUS AND METHOD FOR PRODUCING THE SAME

[75] Inventors: Noriyuki Yamamoto; Yuri Otobe; Takanori Okabe; Minoru Kato, all of Kariya, Japan

[73] Assignee: Kabushiki Kaisha Toyoda Jidoshokki Seisakusho, Kariya, Japan

[21] Appl. No.: 831,809

[22] Filed: Feb. 6, 1992

[30] Foreign Application Priority Data

Feb. 8, 1991 [JP] Japan .................................. 3-17969

[51] Int. Cl.$^5$ .............................................. H01L 29/34
[52] U.S. Cl. .................................... 257/629; 257/136; 257/508; 257/620; 257/787
[58] Field of Search ............... 257/136, 498, 488, 489, 257/355, 508, 536, 629, 630, 632, 635, 636, 638, 644, 646, 620, 669, 787, 788, 793

[56] References Cited

U.S. PATENT DOCUMENTS

| | | | |
|---|---|---|---|
| 4,265,685 | 5/1981 | Seki | 257/609 |
| 4,364,078 | 12/1982 | Smith et al. | 257/620 |
| 4,625,227 | 11/1986 | Hara et al. | 257/669 |
| 4,691,224 | 9/1987 | Takada | 257/636 |
| 4,841,354 | 6/1989 | Inaba | 257/644 |

OTHER PUBLICATIONS

Jaume, D., et al., "High-Voltage Planar Devices..." IEEE Trans on Elec. Dev. Jul. 1991, pp. 1681-1684.

Primary Examiner—Sara W. Crane
Attorney, Agent, or Firm—Brooks Haidt Haffner & Delahunty

[57] ABSTRACT

In a semiconductor apparatus and method for producing the same where an upper surface of a semiconductor chip having a thick film electrode is coated with a passivation film, the semiconductor chip being molded with a resin mold such as a power SIT, a conductive film made of a doped polysilicon, a metal material, or the like and which has a thickness of for example 3000 angstroms or more is circumferentially disposed from a bottom circumference of the thick film electrode to a part of region between a field oxide film and a passivation film so as to effectively prevent cracks in the passivation film caused by a cyclic temperature test from extending into the field oxide film.

5 Claims, 3 Drawing Sheets

SEMICONDUCTOR APPARATUS AND METHOD FOR PRODUCING THE SAME

BACKGROUND OF THE INVENTION

The present invention relates to a semiconductor apparatus and to a method for producing the same, and in particular to a semiconductor apparatus and method for producing the same for use in, for example, an amplifying static induction type transistor wherein a surface of a semiconductor chip having a thick film electrode is coated with a passivation film, the semiconductor chip being molded with a resin mold.

Generally, a semiconductor apparatus such as an electric power amplifying static induction type transistor (hereinafter referred to as a power SIT) uses a thick film electrode of a predetermined thickness on the upper surface of a semiconductor chip to increase the current capacity and improve the withstand voltage of the apparatus. In addition, to stabilize the characteristics of the apparatus, the surface of the semiconductor chip on which the thick film electrode is disposed is coated with a passivation film. Moreover, this semiconductor apparatus is molded with a resin mold and then encased so as to improve the mechanical strength of the entire apparatus.

The characteristics, standards, and so forth of all semiconductor apparatuses (including the above conventional semiconductor apparatus) produced in accordance with predetermined processing steps should be determined by conducting various tests established by, for example, JIS (the Japanese Industrial Standards). In particular, the above power SIT generates a large amount of heat because it dissipates a large amount of power. Therefore, a cyclic temperature test should be conducted to evaluate the durability of the apparatus against variations in temperature.

FIG. 1 shows conditions of a semiconductor chip of a conventional power SIT upon which a cyclic temperature test is conducted. FIG. 1A is a plan view showing the entire surface condition of the semiconductor chip. FIG. 1B is a plan view of a principal portion showing the surface condition of a corner of the semiconductor chip of FIG. 1A. FIG. 1C is a sectional view of the principal portion showing the inner condition of the corner of the semiconductor chip of FIG. 1A.

As shown in FIG. 1A, after a cyclic temperature test has been conducted on a conventional power SIT, on opening the SIT and observing the entire surface condition of the rectangular semiconductor chip 1 in the apparatus it is likely to be revealed that no macroscopic change has taken place on the surface. However, as shown in FIG. 1B, detailed observation of the surface condition of a corner of the semiconductor chip 1 (the portion marked with a circle X in the figure) reveals that a large number of cracks 10 are present on the passivation film 4 disposed between the gate electrode 2 and the EQR electrode 3 and disposed on the circumference of the EQR electrode 3. In addition, as shown in FIG. 1C, a sectional observation reveals that the cracks 10 completely penetrate the passivation film 4 and extend into the field oxide film 5 and the doped polysilicon film 6. Moreover, these cracks 10 occasionally penetrate the field oxide film 5 and the doped polysilicon film 6 and extend into the p-type gate region 7, the n+ type EQR region 8, and the field portion of the n− type epitaxial region 9.

This occurs when the gate electrode 2 and the EQR electrode 3, of the semiconductor apparatus which are disposed on the upper surface of the semiconductor chip 1, are formed of a thin film and the semiconductor chip 1 is then molded with a resin mold. In the cyclic temperature test, the resin mold repeatedly expands and shrinks in accordance with the variation in temperature. The resulting pressure is concentrated in the vicinity of the bottom circumferences of the gate electrode 2 and the EQR electrode 3 of the semiconductor chip 1, thus producing a large number of cracks 10. These cracks 10 remarkably affect the characteristics of the semiconductor apparatus. If the cracks extend into a major semiconductor region such as the field portion 9a of the n--type epitaxial region 9, the designed transistor characteristics cannot be accomplished. In addition, even if the cracks 10 are suppressed from extending into the semiconductor region, as long as the field oxide film 5 in the vicinity of the bottom circumference of the gate electrode 2 is damaged, the withstand voltage is inevitably degraded. Thus, the reliability of a power amplifying semiconductor apparatus in which a large amount of current flows, is seriously reduced.

SUMMARY OF THE INVENTION

An object of the present invention is to solve such problems by providing a semiconductor apparatus, and method for producing the same, in which cracks produced in a passivation film by a cyclic temperature test are prevented from extending into a field oxide film and in which characteristics such as transistor characteristics and withstand voltage characteristics are maintained and improved.

A semiconductor apparatus according to the present invention has a semiconductor chip comprising a field oxide film, a semiconductor region exposed to an opening portion of the field oxide film, a thick film electrode disposed on the upper surface of the semiconductor region, and a passivation film equally disposed on a surface of the field oxide film, this surface including a surface of the thick film electrode, the semiconductor chip being molded with a resin mold. The semiconductor apparatus according to the present invention has a conductive film with a predetermined film thickness, circumferentially disposed from a bottom circumference of the thick film electrode to a region between the field oxide film and the passivation film.

A method of producing a semiconductor apparatus according to the present invention is applied where a semiconductor chip is molded with a resin mold. The method for producing the semiconductor apparatus according to the present invention comprises the steps of circumferentially disposing a conductive film of a predetermined thickness around the circumference of a field oxide film disposed around the outer circumference of a semiconductor region exposed to an opening portion of the field oxide film; disposing a thick film electrode from the inner circumference of the conductive film to the upper surface of the semiconductor region; and equally disposing a passivation film on the surface of the field oxide film, the outer circumference of the conductive film, and the surface of the thick film electrode. The conductive film may be of, for example, doped polysilicon, a metal material, and so forth. The preferred film thickness of the conductive film is for example 3000 angstroms or more, in which cracks can be suppressed.

According to the semiconductor apparatus of the present invention, a conductive film of a predetermined thickness is circumferentially disposed from a bottom circumference of a thick film electrode to a region between a field oxide film and a passivation film. In this construction, although cracks produced in the passivation film by a cyclic temperature test on the semiconductor apparatus extend to the surface layer of the conductive film disposed in the vicinity of a bottom circumference of the thick film electrode, the conductive film effectively prevents them from extending into the field oxide film on the upper surface of the semiconductor region.

Moreover, according to the method of producing the semiconductor apparatus of the present invention, in forming a semiconductor chip which is accommodated in the semiconductor apparatus, a conductive film of a predetermined thickness is circumferentially disposed on the circumference of a field oxide film disposed on the outer circumference of an opening portion of the field oxide film. Thereafter, a thick film electrode is disposed from the inner circumference of the conductive film to the upper surface of a semiconductor region exposed to the opening portion of the field oxide film. Thereafter, a passivation film is equally disposed on the upper surface of the field oxide film, the outer circumference of the conductive film, and the upper surface of the thick film electrode, which are exposed to the outside of the semiconductor chip. Thus, a conductive film which prevents cracks produced in the passivation film by a cyclic temperature test from extending into the field oxide film, is disposed in the vicinity of the bottom circumference of the thick film electrode.

BRIEF DESCRIPTION OF DRAWINGS

FIG. 1 shows conditions of a semiconductor chip of a conventional power SIT upon which a cyclic temperature test is conducted;

EMBODIMENT

An embodiment of the present invention is described in detail with reference to the accompanying drawings. A power SIT (power amplifying static induction type transistor) is described as an example. In addition, the method of producing the power SIT is described.

Figure 1A:
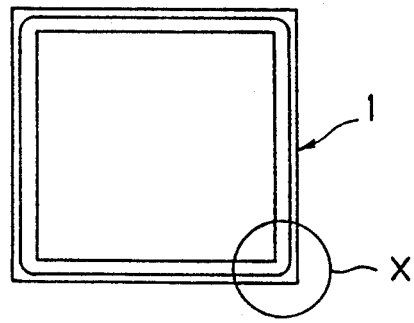
FIG. 1A is a plan view showing the entire surface condition of the semiconductor chip.
Figure 1B:
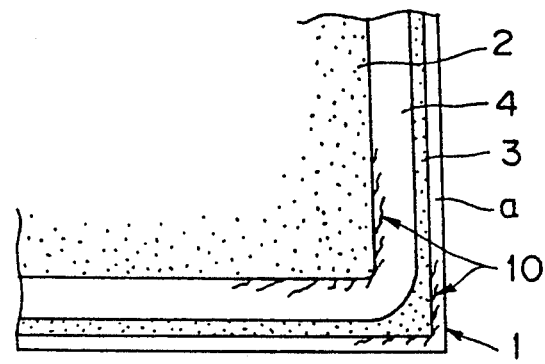
FIG. 1B is a plan view of a principal portion showing the surface condition of a corner of the semiconductor chip of FIG. 1A.
Figure 1C:
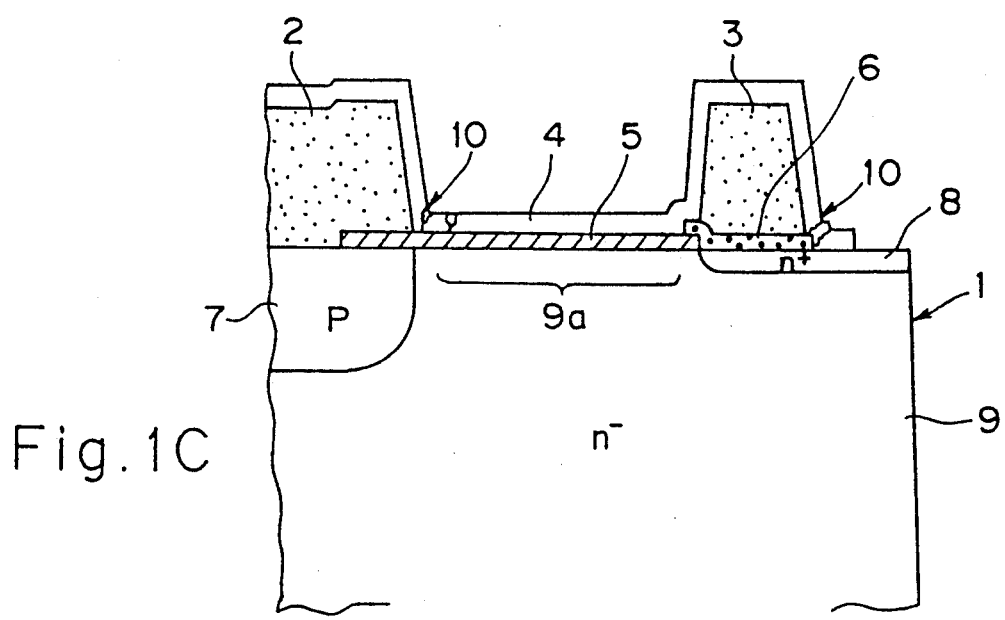
FIG. 1C is a sectional view of the principal portion showing the inner condition of the corner of the semiconductor chip of FIG. 1A.
Figure 2:
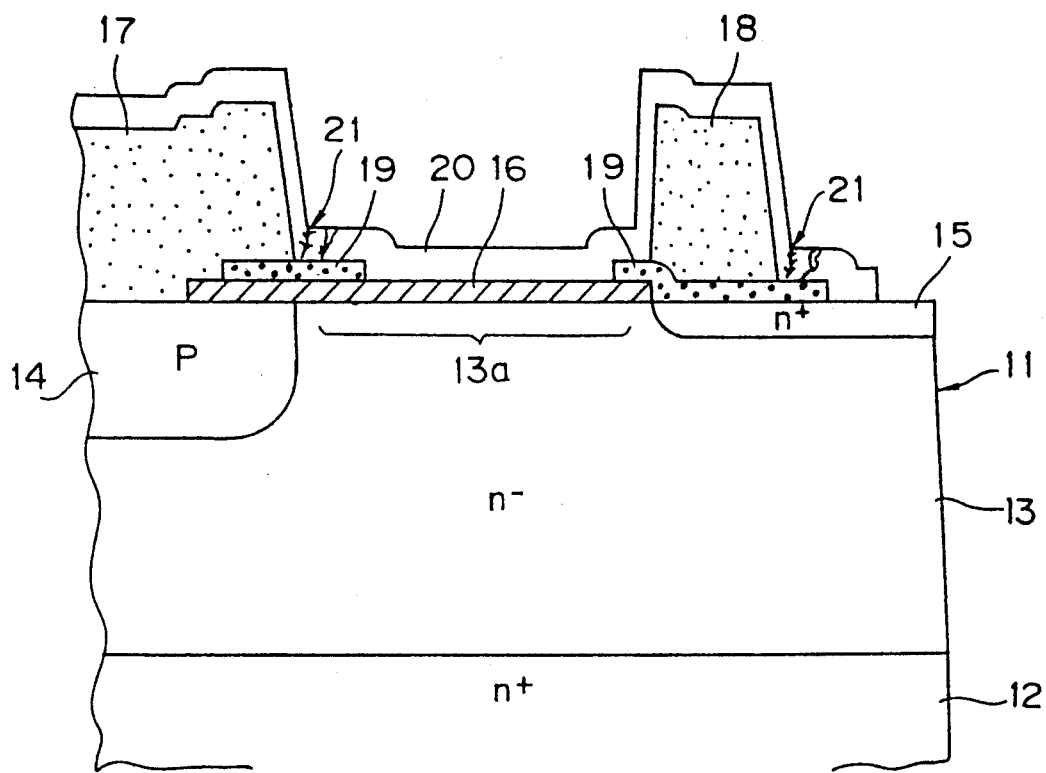
FIG. 2 is a sectional view of a principal portion showing the inner construction of a corner of a semiconductor chip accommodated in the power SIT in accordance with the present invention.

FIG. 2 is a sectional view of a principal portion showing the inner construction of a corner of a semiconductor chip accommodated in the power SIT in accordance with the present invention. This figure also shows the inner condition of the corner of the semiconductor chip upon which a temperature cyclic test is conducted for the power SIT.

As shown in the figure, in the semiconductor chip 11 of the power SIT, an n+ type drain region 12, an n-type epitaxial region 13, a p type gate region 14, and an n+ type EQR region 15 are formed as semiconductor regions made of silicon. The n+ type drain region 12 is formed of a silicon substrate (a wafer) which is the base material of the semiconductor chip 11. The n− type epitaxial region 13 disposed over the n+ type drain region 12 is formed by epitaxial growth on the upper surface of the n+ type drain region 12. The p type gate region 14 is formed by diffusing p type impurities in intermediate concentration from the upper surface of the n− type epitaxial region 13. The n+ type EQR region 15 is formed by diffusing n type impurities in high density from the upper surface of the n− type epitaxial region 13.

The semiconductor chip 11 with various semiconductor regions has a field oxide film 16 of $SiO_2$ (silicon dioxide) a predetermined thickness disposed from the upper surface of a field portion 13a of the n− type epitaxial region 13 to a part of an upper surface of the p type gate region 14. A gate electrode 17 and an EQR electrode 18, which are thick film electrodes made of Al (aluminum), are disposed on respective upper surfaces of the p type gate region 14 and the n+ type EQR region 15 where the field oxide film 16 is exposed. However, the gate electrode 17 is disposed through a doped polysilicon film 19 circumferentially disposed in the vicinity of the bottom circumference thereof. The doped polysilicon film 19 is a conductive film containing impurities and is of a predetermined thickness. The EQR electrode 18 also is disposed through the doped polysilicon film 19 which is disposed on the bottom and in the vicinity of the circumference thereof and has a predetermined thickness.

A doped polysilicon film 19 is circumferentially disposed in the vicinity of the bottom circumference of the gate electrode 17 so that 19 it extends from the bottom circumference of the gate electrode 17 disposed on the upper surface of the field oxide film 16 to the field oxide film 16 disposed on the upper surface of the field portion 13a of the n− type epitaxial region 13. Another doped polysilicon film 19 is disposed on the bottom surface of the EQR electrode 18 and in the vicinity thereof so that it extends from the bottom surface of the EQR electrode 18 in all the directions including the direction of the field oxide film 16. When the doped polysilicon films 19 are disposed, the respective extensions of the gate electrode 17 and the EQR electrode 18 from the bottom circumference are preferably in the range from 10 micrometers to 30 micrometers and their thicknesses are preferably 3000 angstroms or more.

After the thick film electrodes, the conductive films, and so forth have been disposed, a passivation film 20 of $SiO_2$ of a predetermined thickness is equally deposited on the respective surfaces of the field oxide film 16, the gate electrode 17, the EQR electrode 18, and the doped polysilicon film 19, which are disposed on the outside of the semiconductor chip 11. The production of the semiconductor chip 11 is thereby completed. Thereafter, the semiconductor chip 11 is molded with a resin mold (not shown in the figure) and the desired power SIT is completed. Thereafter, a cyclic temperature test for determining the characteristics, standards, and so forth of the power SIT as a final product is conducted.

In the cyclic temperature test, the resin mold repeatedly expands and shrinks in accordance with the variation in temperature. The resulting pressure is concentrated in the vicinity of the bottom circumferences of the gate electrode 17 and the EQR electrode 18 of the semiconductor chip 11, thus, as in the conventional apparatus, producing a large number of cracks 21 in the passivation film 20 disposed in such regions. However, the doped polysilicon film 19 deposited in the vicinity of the bottom circumference of the gate electrode 17 and the EQR electrode 18 effectively prevents these cracks 21 from further extending into the field oxide film 16 and various semiconductor regions. In addition, since the voltage of the doped polysilicon film 19 disposed in the vicinity of the bottom circumference of the gate electrode 17 is the same as that of the gate electrode 17, traveling electric charges in the resin mold which enter the semiconductor chip through the cracks 21 are electrically neutralized. Thus, a pseudo effect the same as the field plate can be obtained. Consequently, in the power SIT of the above construction, the designed transistor characteristics can be satisfactorily accomplished, thereby preventing the field oxide film 16 from being damaged and the characteristics of the withstand voltage from being degraded.

FIG. 3 shows sectional views of a principal portion of a corner of the semiconductor chip 11 describing major processing steps in a method for producing a power SIT of the embodiment of the present invention.

Figure 3A:
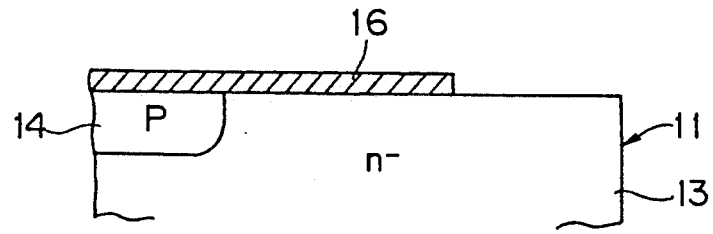
FIGS. 3A through 3E show sectional views of a principal portion of a corner of the semiconductor chip 11 describing major processing steps in a method of producing a power SIT in an the embodiment of the present invention.

First, as shown in FIG. 3A, a field oxide film 16 of $SiO_2$ of a predetermined film thickness is disposed from the upper surface of a field portion of an n− type epitaxial region 13 on a semiconductor chip 11 to the upper surface of a p type gate region 14 disposed thereon. Practically, the respective upper surfaces of the n− type epitaxial region 13 and the p type gate region 14 are oxidized in an oxygen atmosphere at a high temperature. Thereafter, a field oxide film 16 of $SiO_2$ is formed on the entire surfaces of the n− type epitaxial region 13 and the p type gate region 14. Thereafter, an unnecessary portion of the upper surface of an n+ type EQR region 15 which will be formed in a later processing step is selectively etched and removed.

Figure 3B:
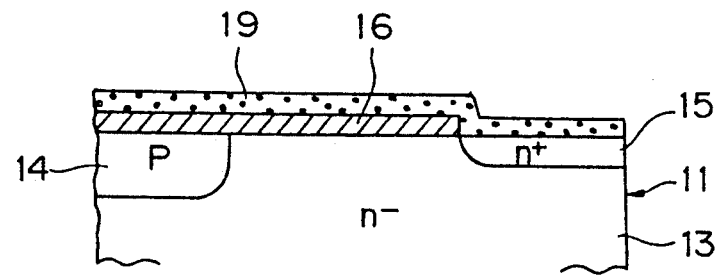

Thereafter, as shown in FIG. 3B, a doped polysilicon film 19 which contains n type impurities and is of a predetermined thickness (3000 angstroms or more) is continuously disposed on the upper surface of the field oxide film 16 and the upper surface of the n− type epitaxial region 13 where an n+ type EQR region 15 will be formed in a later processing step. Thereafter, the n type impurities contained in the doped polysilicon film 19 being disposed are diffused to the upper surface of the n− type epitaxial region 13, thereby forming an n+ type ERQ region 15. It is preferable to gradually deposit the doped polysilicon film 19 by using a CVD method until the desired film thickness can be obtained.

Figure 3C:
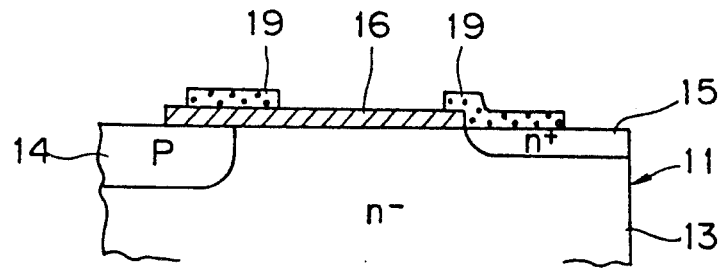

Thereafter, as shown in FIG. 3C, unnecessary portions of the doped polysilicon film 19, which are those portions other than the region in the vicinity of the bottom circumference of a gate electrode 17 which will be disposed in a later processing step and regions at the bottom surface and in the vicinity of the circumference of an EQR electrode 18 which will be disposed in a later processing step, are selectively etched and removed. In other words, this etching step provides both the circumferentially disposed region of the doped polysilicon film 19 in accordance with the vicinity of the bottom circumference of the gate electrode 17 and the disposed region of the doped polysilicon film 19 in accordance with the vicinity of the bottom circumference of the EQR electrode 18. Following this etching step, a part of the field oxide film 16 disposed over the upper surface of the p type gate region 14 is etched and removed so as to provide a contact hole for the gate electrode 17. In other words, according to the conventional apparatus, the polysilicon film 19 is etched and removed. The feature of this processing step is that the doped polysilicon film 19 which is removed in the conventional apparatus is disposed along with the doped polysilicon film 19 disposed in the vicinity of the bottom circumference of the gate electrode 17.

Figure 3D:
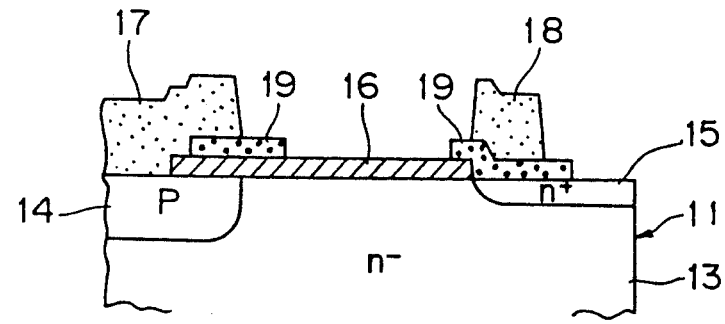

Thereafter, as shown in FIG. 3D, a gate electrode 17 is disposed on the upper surface of the p type gate region 14 through the vicinity of an opening portion of the field oxide film 16 and the inner circumference of the doped polysilicon film 19. In addition, an EQR electrode 18 is disposed on the upper surface of the n+ type EQR region 15 through the center portion of the doped polysilicon film 19. Practically, Al is deposited on the entire upper surface of the semiconductor chip 11 by using a vacuum evaporation method, a spattering method, or the like, until a predetermined film thickness of Al is obtained. Thereafter, unnecessary portions, which comprise the upper surface of the field oxide film 16 and so forth, are selectively etched and removed.

Figure 3E:
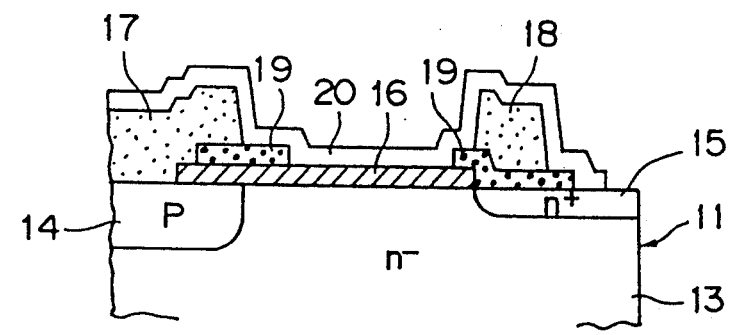

Last, as shown in FIG. 3E, when the above processing step is completed, a passivation film 20 of $SiO_2$ is equally disposed on the surfaces of the field oxide film 16, the gate electrode 17, the EQR electrode 18, the doped polysilicon film 19, and so forth, which are exposed to the outside of the semiconductor chip 11. When the passivation film 20 is disposed, it is preferable to deposit $SiO_2$ on the surfaces of the portions exposed to the outside of the semiconductor chip 11 by using the CVD method until a predetermined film thickness is obtained. After the passivation film 20 has been disposed, the production of the semiconductor chip 11 is completed. By molding the completed semiconductor chip 11 with a resin mold, a power SIT with a doped polysilicon film 19 for preventing cracks 21 from extending into the field oxide film 16, as shown in FIG. 2, can be obtained.

The above describes, an example of a power SIT and a method for producing the same by using a doped polysilicon material for a conductive film for preventing cracks from extending into semiconductor regions. Besides this example, a conventional polysilicon material which does not contain impurities can be also used. In this case, in the processing step shown in FIG. 3B, the polysilicon material is deposited by using the CVD method until a predetermined film thickness is obtained. Thereafter, ions are implanted from the upper surface of the polysilicon material, thereby introducing desired impurities. Of course, when semiconductor regions such as an n+ type EQR region 15 and so forth are formed, the introduction of impurities by ion implantation can be used.

As substitutes for the polysilicon material, for example metal materials such as Cr (chromium), Mo (molybdenum), and Ta (tantalum) can be used. In this case, the semiconductor regions such as the n+ type EQR region 15 and so forth are formed of a deposited polysilicon material. Thereafter, the polysilicon material is etched and removed. Then, metal particles are deposited by spattering, onto regions in which cracks should be suppressed. When a metal material is used for the conductive film, since the metal material is disposed after semiconductor regions such as an n+ type EQR region 15 and so forth have been formed, the film thickness of the polysilicon material need not be limited in forming semiconductor regions in ion implantation and annealing processing steps necessary for a polysilicon material. Thus, when a metal material is used for a conductive film, its thickness can be freely set. For example, for a 1-micrometer-thick conductive film, it is further effectively to prevent cracks from extending into semiconductor regions.

An embodiment of the present invention, in which the semiconductor apparatus and the method for producing the same is applied to a power SIT, has been described. However, the application of the present invention is not limited to a power SIT. It can also be applied to all semiconductor apparatuses where thick film electrodes are disposed on semiconductor chips, on which passivation films are disposed, where the semiconductor chips are molded with a resin mold.

As described above, according to the semiconductor apparatus of the present invention, since a conductive film of a predetermined thickness is circumferentially disposed from the bottom circumference of a thick film electrode to a region between a field oxide film and a passivation film, the extension of cracks in the passivation film disposed in the vicinity of the bottom circumference of the thick film electrode is effectively suppressed and thereby prevented from extending into the field oxide film. The bad effect of cracks on the characteristics of the semiconductor apparatus can thus be eliminated. Thus, various characteristics of the semiconductor apparatus, such as transistor characteristics and voltage withstand characteristics, can be maintained or improved. Consequently, the reliability of the semiconductor apparatus is remarkably improved.

Moreover, according to the method of producing the semiconductor apparatus of the present invention, in forming a semiconductor chip which is accommodated in a semiconductor apparatus, a conductive film of a predetermined thickness is circumferentially disposed on the circumference of a field oxide film disposed on the outer circumference of an opening portion of the field oxide film. Thereafter, a thick film electrode is disposed from an inner circumference of the conductive film disposed in the conductive film disposing step to an upper surface of a semiconductor region exposed to the opening portion of the field oxide film. Thereafter, a passivation film is equally disposed on the upper surface of the field oxide film, the outer circumference of the conductive film, and the surface of the thick film electrode, which are exposed to the outside of the semiconductor chip. Thus, a semiconductor apparatus with a conductive film, in which cracks in the passivation film are prevented from extending into the field oxide film, disposed in the vicinity of the bottom circumference of the thick film electrode can be obtained.

What is claimed is:

1. A semiconductor apparatus having a semiconductor chip, which is molded with a resin mold said semiconductor chip comprising:
   a field oxide film,
   a semiconductor region exposed to an opening portion of said field oxide film,
   a thick film electrode disposed on the upper surface of said semiconductor region, and a passivation film disposed on a surface including said field oxide film and said thick film electrode,
   wherein a conductive film of a predetermined thickness is circumferentially disposed from a bottom circumference portion of said thick film electrode to a region between said field oxide film and said passivation film.

2. The semiconductor apparatus as set forth in claim 1, wherein said conductive film is made of doped polysilicon.

3. The semiconductor apparatus as set forth in claim 1, wherein said conductive film is made of a metal material.

4. The semiconductor apparatus as set forth in claim 1, wherein the thickness of said conductive film is 3000 angstroms or exceeds 3000 angstroms.

5. The semiconductor apparatus as set forth in claim 1, wherein said thick film electrode is a gate electrode and said semiconductor chip further comprises an EQR electrode, and wherein said gate electrode and said EQR electrode have respective extensions from a bottom circumference, each of which is in the range of from ten micrometers to thirty micrometers.

* * * * *